United States Patent [19]

Guo

[11] Patent Number: 5,451,894
[45] Date of Patent: Sep. 19, 1995

[54] DIGITAL FULL RANGE ROTATING PHASE SHIFTER

[75] Inventor: Bin Guo, Fremont, Calif.

[73] Assignee: Advanced Micro Devices, Inc., Sunnyvale, Calif.

[21] Appl. No.: 21,691

[22] Filed: Feb. 24, 1993

[51] Int. Cl.⁶ .................... H03H 11/16; H03H 11/26
[52] U.S. Cl. .................... 327/241; 327/237; 327/244; 327/277
[58] Field of Search .............. 307/262, 601, 603, 606; 328/55, 155; 375/120; 327/237, 241, 243, 244, 231, 261, 263, 276, 277, 284

[56] References Cited

U.S. PATENT DOCUMENTS

| | | | |
|---|---|---|---|
| 4,347,480 | 8/1982 | Ferriss | 328/55 |
| 4,604,582 | 8/1986 | Strenkowski et al. | 328/55 |
| 4,618,787 | 10/1986 | Jacksier et al. | |
| 4,637,018 | 1/1987 | Flora et al. | 328/55 |
| 4,754,164 | 6/1988 | Flora et al. | |
| 4,789,996 | 12/1988 | Butcher | 328/155 |
| 4,868,430 | 9/1989 | Stewart | |

FOREIGN PATENT DOCUMENTS 4104329 8/1991 Germany .

Primary Examiner—Timothy P. Callahan
Assistant Examiner—Toan Tran
Attorney, Agent, or Firm—Gerald M. Fisher

[57] ABSTRACT

The use of three identical delay line circuits enables one of said delay circuits to be connected as a minimum delay reference and a second delay circuit to then be continuously compared to said minimum delay reference delay circuit to provide a code which calibrates the second delay line circuit by indicating and controlling continuously the length of the second delay line circuit to provide an exactly 360-degree phase shift of the reference signal under variable temperatures, pressures and voltages. Then, by maintaining the length of the third identical delay line at said determined 360-degree length, and by being able to select any tap output of the third identical delay line circuit responsive to a command, the third delay line circuit provides an adjustable, feedback calibrated, delay line circuit.

6 Claims, 8 Drawing Sheets

FIG. 7a (A) $S(l)_{(n+1)} = S(l-1)_{(n)} \overline{UPDN} + S(l+1)_{(n)} UPDN$  ( $l = 1,...,J-1$ )

(B) $S(l)_{(n+1)} = S(l-1)_{(n)} \overline{C(l-1)_{(n)}} \overline{UPDN} + [S(l+1)_{(n)} \overline{C(l)_{(n)}} + S(0)_{(n)} C(l)_{(n)}] UPDN$  ( $l = J,...N$ )

(C) $WA(l)_{(n+1)} = S(l-1)_{(n)} C(l)_{(n)} UPDN$  ( $l = J,...N$ )

| | | $S(l)_{(n)}$ | $S(l-1)_{(n)}$ | $S(l+1)_{(n)}$ | UPDN | $C(l-1)_{(n)}$ | $C(l)_{(n)}$ | $S(l)_{(n+1)}$ | $WA(l)_{(n+1)}$ |
|---|---|---|---|---|---|---|---|---|---|
| 701 | NORMAL UP-SHIFT "0" | X | 0 | X | 1 | 0 | 0 | 0 | 0 |
| 702 UP ADJ | NORMAL UP-SHIFT "1" | X | 1 | X | 1 | 0 | 0 | 1 | 0 |
| 703 | "WRAP AROUND" "0" TO ST(1) | X | 0 | X | 1 | 0 | 1 | 0 | 0 |
| 704 | "WRAP AROUND" "1" TO ST(1) | X | 1 | X | 1 | 0 | 1 | 1 | 1 |
| 704' | REJECT "1" AT STAGE FOLLOWING ESP | X | X | X | 1 | 1 | 0 | 0 | 0 |
| 705 | NORMAL DOWN-SHIFT "0" | X | X | 0 | 0 | X | 0 | 0 | X |
| 706 DN ADJ | NORMAL DOWN-SHIFT "1" | X | X | 1 | 0 | X | 0 | 1 | X |
| 707 | "WRAP AROUND" "0" TO ST(K) | 0 | X | X | 0 | X | 1 | 0 | X |
| 708 | "WRAP AROUND" "1" TO ST(K) | 1 | X | X | 0 | X | 1 | 1 | X |

FIG. 7b

DIGITAL FULL RANGE ROTATING PHASE SHIFTER

FIELD OF INVENTION

This invention relates to digital phase and timing control and particularly to an all digital method and apparatus for controlled phase shifting, signal synchronization and data recovery.

RELATED APPLICATIONS

The applicant has simultaneously filed the below listed patent applications, which relates to a high data rate digital data/clock recovery system, said application are incorporated herein by reference:

"All Digital High Speed Algorithmic Data Recovery Method and Apparatus Using Locally Generated Compensated Broad Band Time Rulers and Data Edge Position Averaging," Ser. No. 08/0921924; filing date Feb. 24, 1993; inventor Bin Guo; AMD Docket Number A895.

"Digital Variable In-Lock Range Phase Comparator", Ser. No. 08/021712; filing date Feb. 24, 1993; inventor Bin Guo; AMD Docket Number A911.

BACKGROUND OF THE INVENTION

In clock or data recovery and in other phase and timing control operations, phase or timing adjustments are usually performed after a phase or timing error is detected. Traditionally, a Phase Locked Loop (PLL) is employed, in which the frequency of a Voltage Controlled Oscillator (VCO) is adjusted to achieve the phase adjustment or alignment through a number of cycles. The amount of the phase change is the integral of the difference between the VCO frequency and the reference frequency. These are generally analog PLL circuits which contain various lumped capacitors and lumped resistors to form the analogue low pass filter function for obtaining a smoothed or filtered control signal for VCO. Monolithic circuit integration of the PLL along with large scale digital circuitry is difficult, especially using standard manufacturing processes for digital circuits. In addition, problems associated with phase locked loop design such as susceptibility to digital switching noise limits the traditional CMOS analog PLL design to applications, at less than 100 MHZ.

In digital data recovery or digital signal synchronization applications, digitally controlled delay cell technologies are often utilized. A plurality of such delay cells can be cascaded to form a delay line which can then delay a signal, whether data, clock or control signal, to provide a plurality of delayed, or phase shifted copies of the original signal from the taps of the delay line. These delayed signals can then be sampled, or detected, or registered to be analyzed in subsequent logic to determine their phase relationship with a reference signal or signals to enable signal synchronization, data recovery and other tasks. Prior art tapped delay lines are known which can provide phase shifted copies of a signal, but the delay line or the taps of the delay line are not regulated or calibrated. In one such prior arrangement described in U.S. Pat. No. 4,821,297, a locally generated reference clock running at the data rate frequency is delayed or phase shifted by an N-length tapped delay to provide N copies of the clock with phase step of $\Delta\Phi$ between each adjacent tap. The phase adjustment step size of the resolution is determined by the delay amount per tap and the total phase shift is determined by N times the phase step. Since no delay time regulation is provided, the total phase shift is not a constant and depends on various manufacturing processes or operating conditions if it is implemented in a monolithic integrated circuit format. Even if the clock reference frequency is known so that the delay line can be designed to be long enough to ensure all possible phases, problems arise when there is a frequency difference between the data frequency or the remote transmitter clock and the local receiver clock. If the data frequency is slightly lower than the locally generated reference clock frequency, the phase decision circuit will detect this slow phase drift and inform the delay path selector to increment the delay. This process will continue as long as the data keeps arriving. Theoretically, the delay line has to be infinitely long to provide a constant phase increment in the same direction. Accordingly, a need exists to have a method and apparatus which can handle the above problem, and which provides a phase shift of equal increments or decrements for unlimited number of cycles.

In the simultaneously filed related application, "All Digital High Speed Algorithmic Data Recovery Scheme and Apparatus using Locally Generated Compensated Broad Band Time Ruler and Data Edge Position Averaging," AMD Docket Number A895, Ser. No. 8/021924 filed Feb. 24, 1993, the locally generated time ruler used as the bit rate recovered clock is constantly phase compared with the averaged data transition positions, and is phase shifted by an up/down control signal produced in a edge distribution sampler and phase adjust decision circuit. In the event that a constant frequency difference exists between the incoming data and the locally generated time ruler clock, a slow process takes place to adjust the phase relation of the clock leading edge to follow the slow "drifting" of the center of the data bit (known as the center of the data eye) in relation to the local time ruler signal. A range of delay is needed which provides tapped outputs for all possible phases in the given resolution determined by the delay of the delay cell, and which is calibrated to shift 360 degree of the locally generated timing signal such that the signal from the last tap of the calibrated range has the same phase as that from the first tap.

SUMMARY OF THE INVENTION

A principal objective of the present invention is to provide an all digital full range phase shifting method and scheme.

A further objective of the invention is to provide a digital method that calibrates the delay range to be equal to a constant value, which constant value can be a bit period of a serially received data, or a cycle period of a clock signal, or 360 degree phase range of a periodic signal, to continuously provide phase increments or decrements with a constant phase step by the control of an up/down digital control signal.

A still further objective of the invention is to provide a digital 360 degree phase shift circuit which is particularly suitable for digital integrated circuit implementation and which can digitally filter preselected noise.

The method and apparatus of my invention is particularly useful and important when the two signals which need to be synchronized have a frequency offset or have a variable or "drifting" phase relation. One such example is in a serial data link where a received incoming data signal has a frequency determined by the remote transmitter clock, while the receiver clock timing signal is generated by a local frequency reference. Although the two frequency references are normally required or allowed to be only a small offset (50 ppm or less), the accumulation of the offset will result in increased phase offset and eventually in a cycle slipping. In order to keep the two signals synchronized, a constantly incrementing or decrementing phase adjustment is needed.

The preferred embodiment of the present invention utilizes a tapped delay line and a MUX to form a digitally adjustable delay to provide phase shifted copies of an input signal. An up/down control signal controls the increment or decrement selection of the delay so that a positively or negatively phase-shifted copy of the input signal is selected each time the selection is enabled. The digitally adjustable delay is able to provide phase shifting in 360 degree range in all operating conditions. An on-the-fly Phase Shift Range Calibrator detects the delay variation due to temperature or power supply variation and locates the output tap known as the End Stage Position (EPS) in the digitally controlled delay from which the input signal is delayed exactly 360 degrees. In the event that the up/down control indicates that a constant positive (up) phase shift is needed, the Rotating Phase Shift Control moves the delay path selection one tap up every enabled clock until the ESP is reached. If a further up-shift is still indicated, the phase shift control will "wrap around" to select the 1st tap as the delay path such that a positive phase shift step is made relative to the last selection where the control selects the tap output stage indicated by the phase range calibrator as the ESP. The same operation is performed when the up/down control indicates that a negative (down) phase shift is needed. The rotating phase shifting scheme requires only an up/down signal and an enable signal from the phase detection and adjust decision logic. The digitally controlled or selected delay is adjusted one step at a time and, by virtue of its construction, is designed to be able to "freeze", or hold a position in case there is no data to compare. The previous phase adjustments are also able to be "memorized" by the control logic which sends the up/down control signal, such that certain adjustment "patterns" or some modulating frequencies from noise sources may be recognized and filtered by the control logic.

DRAWINGS

FIGS. 7A and 7B are the logic equations and the truth table for the block diagram of FIG. 5.

DETAILED DESCRIPTION

Figures 1A, 1B:
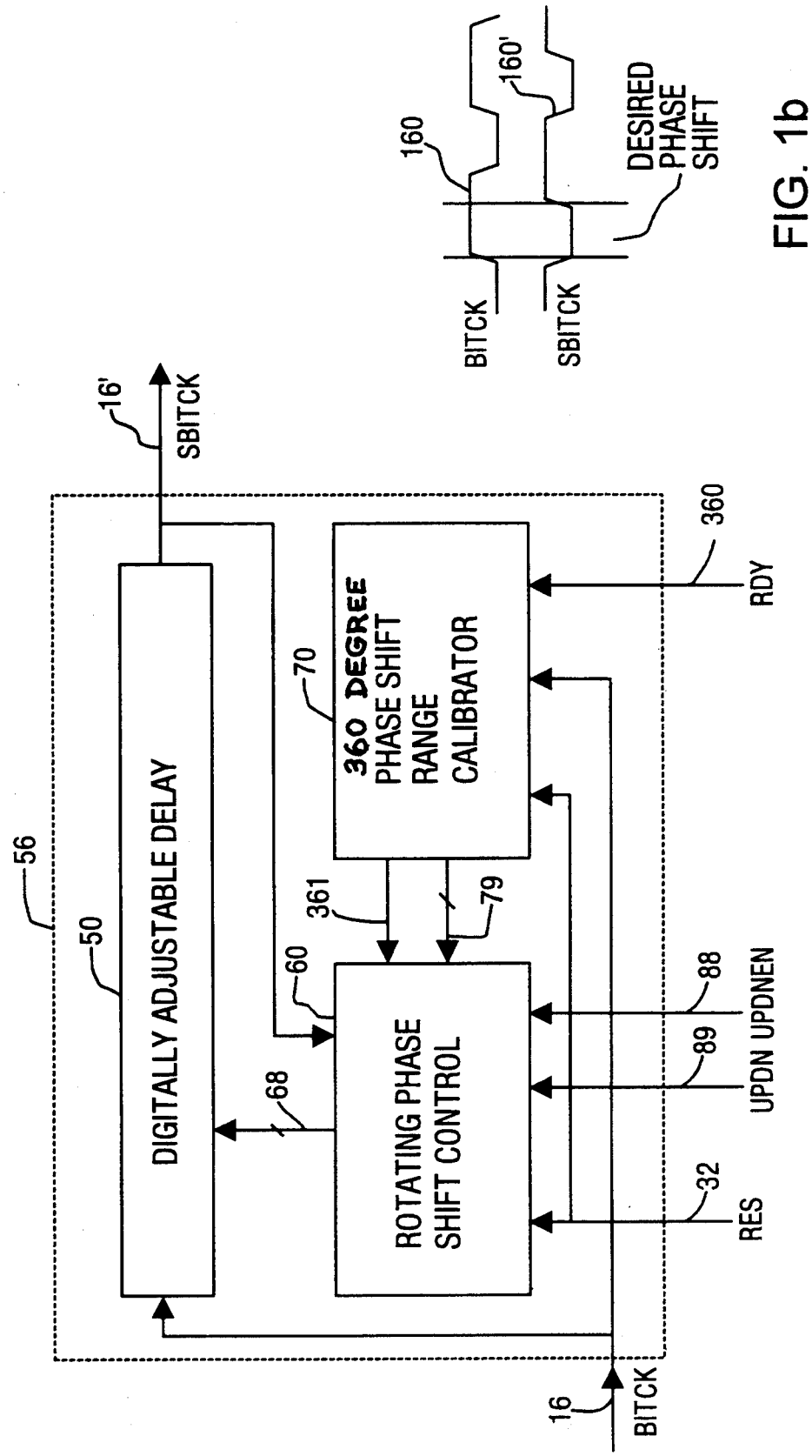
FIG. 1A is a block diagram of my inventive all digital, bi-directional 360 degree phase rotating shifter.
FIG. 1B is illustrative of the waveform of a typical input and output signal of FIG. 1A.

With reference to FIG. 1A, the digitally adjustable delay 50 receives BITCK 16 and performs phase-shifting on that signal, providing the output as SBITCK 16' which is the phase shifted copy of the original signal BITCK 16, as shown in FIG. 1B. Waveform SBITCK 16' can be a phase shifted copy of waveform 16 by any desired amount with resolution of one adjustable time step. The phase shift is controlled by the parallel digital control code 68 from the Rotating Phase Shift Control 60. Rotating Phase Shift Control 60 only requires an input of UPDN (up/down) 89 and UPDNEN (up/down enable) 88 to informs this circuit to provide positively increasing phase shift (UP) or negatively increase phase shift (DOWN) from the current phase. UPDN 89 should be "1" when further positive phase shift is needed, and a "0" when negative or less phase shift is desired. UPDNED 88 is the adjustment enabling signal. UPDNEN should be a "1" if the adjustment needs to be performed and a "0" if current phase shift is to be frozen or maintained. Phase Shift Range Calibrator 70 constantly monitors on-the-fly the delay change due to variations in operating conditions, and sends a parallel digital code 79 to the rotating phase shift control 60 to identify the current position of the stage in the delay line 50 where the original signal is delayed a full cycle or 360 degrees. I call this the End Stage Position Pointer (ESPP). RDY 360 is a signal to enable the calibration process after initial powerup. RES 32 is a signal for resetting the circuits during the power-up sequence or in other occasions when a re-start is necessary.

Figure 2:
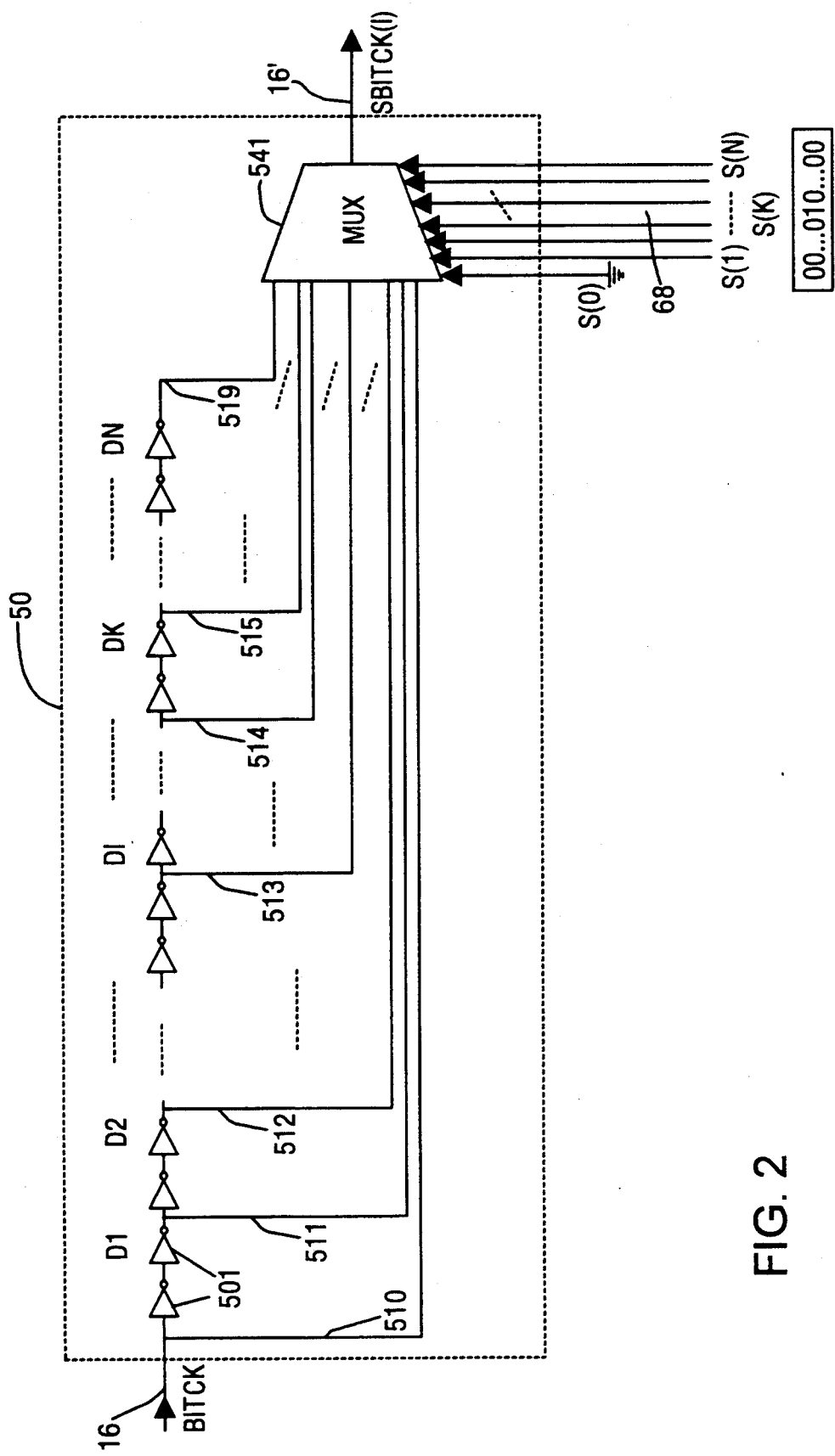
FIG. 2 is a block diagram of one embodiment of the Digitally Adjustable delay.
Figure 3:
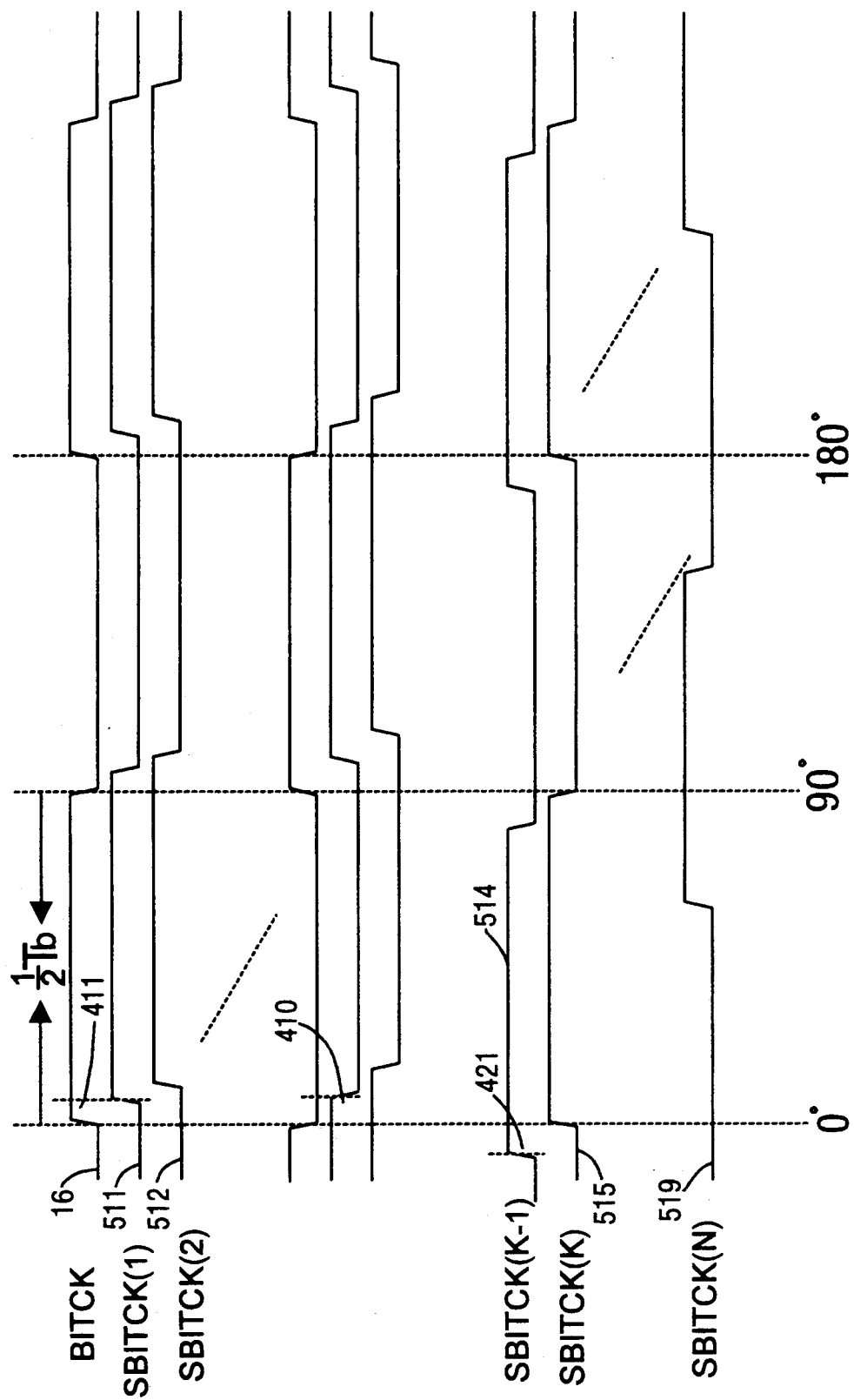
FIG. 3 is the timing diagram of the circuit in FIG. 2.

FIG. 2 shows one embodiment of the Digitally Adjusted Delay 50 which consists of a series of cascaded inverters 501 and a MUX 541 or other types of fast path selector. The input to the MUX are the taps from the delay chain for every other inverter via lines 511, 512, etc. for a total of N pairs of inverters. The control inputs to the MUX S(1) through S(N) 68, are outputs from the Rotating Phase Shift Control 60, FIG. 1A which bits are all "0's" except for one "1" which will select the operative corresponding delay path. The control input S(0), which would select input on line 510 if it is a "1", is tied to ground potential to disable the selection. If stage DK is the ESP, i.e., is found to be the stage at which signal BITCK is delayed or phase shifted a full 360 degrees cycle, the delayed signal at the output of the stage DK on line 515 should coincide with that at the input on line 16. This can be better seen in FIG. 3, the timing diagram of the delay, where the output signal SBITCK(K) of 515 is coincident with signal BITCK 16 on line 16. A next positive phase shift step can be achieved if the selection moves to stage 1, shown as SBITCK(1) 511, where a phase shift 411 equal to the delay of two inverters is shown. It is seen that an endless positive phase shift can be achieved if the digital control 68, FIG. 2, steps through from S(1) to S(k) then rotates or "wraps around" to S(1) and so on, where S(K) corresponds to the 360 degree phase shift end stage or the ESP. In an integrated circuit format, the delay of the inverter cells 501, FIG. 2, vary with process, environment and power supply. For a given cycle time or 360 degree phase shift, K could be a different number due to the above factors. To acquire accurate and calibrated 360 degree phase shift rotation, the delay of the inverters need to be constantly detected so that an accurate ESP location can be maintained.

Figure 4A:
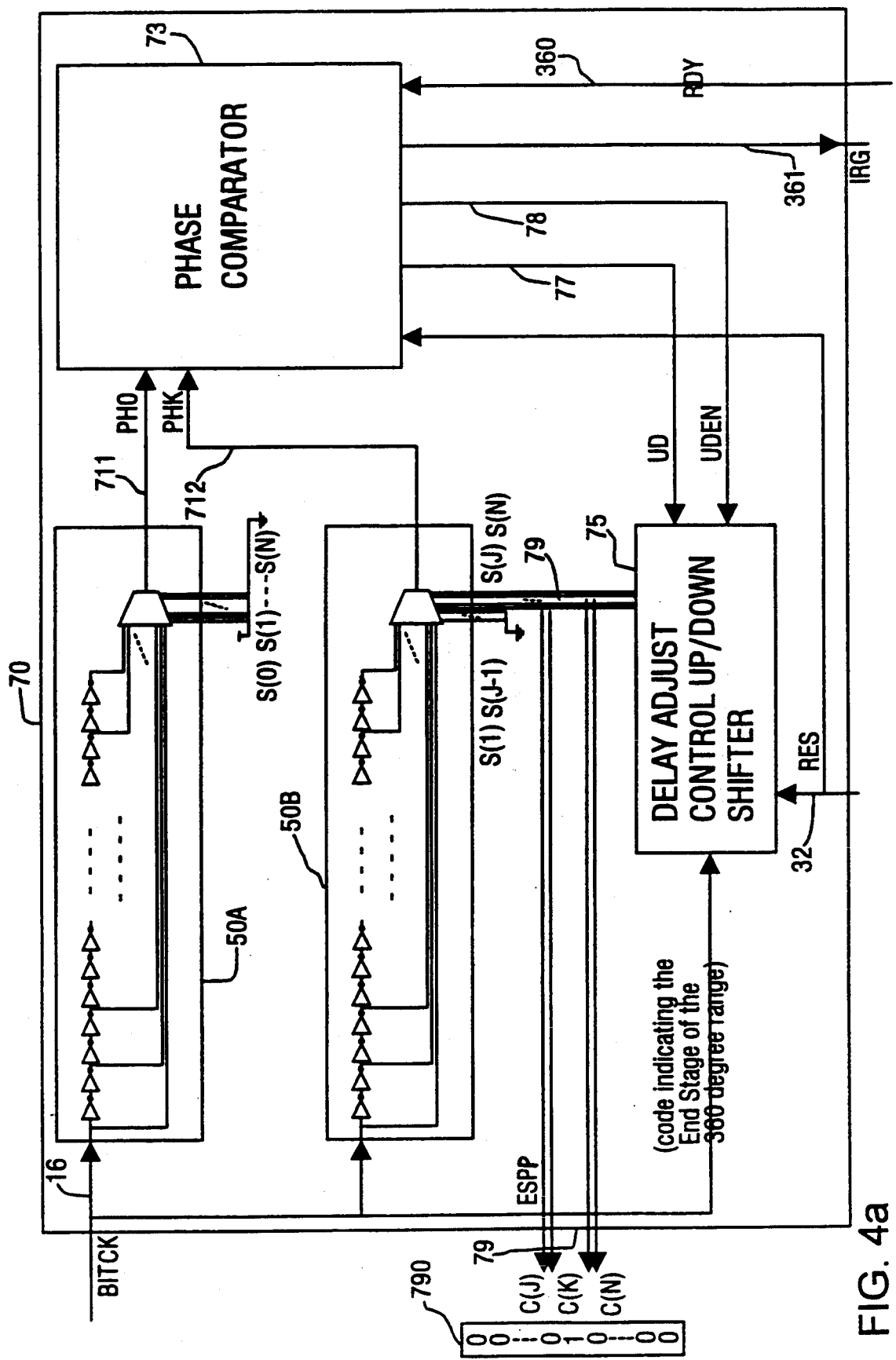
FIG. 4A is the block diagram of the Phase Shift Range Calibrator.

The block diagram of the Phase Shift Range Calibrator 70, FIG. 1, is shown in FIG. 4A. Two digitally adjusted delays 50A and 50B, both preferably constructed exactly the same way as that of 50, FIG. 2, are used to calibrate the delays to find the ESP location. The controls to delay 50A are set such that it selects the first path of the delay by connecting S(0) to "1" while the rest are set to "0", thus acting as a "dummy" delay. The selection for delay 50B is controlled by a MUX50B' responsive to the parallel digital code 79 from the delay adjust up/down shifter 75 which is in turn controlled by the up/down signal UD 77 and adjust up/down enable signal UDEN 78 from the phase comparator 73. Controls S(1) through S(J-1) is connected to "0" to disable stage 1 through stage (J-1) from the calibration rotation based on the assumption that at least J stages are required to delay a full cycle for a given signal in any process or operating conditions. At initial power-up, the control may be reset to a pre-specified code to select a delay path, which is often not the correct path to delay the full cycle or 360 degree of the signal. The phase difference of delayed signal at 711 (ph0) and 712 (phk) is detected by the phase comparator 73, and an UD signal is generated to signify the delay adjust control up/down shifter to add or subtract delay stages to reduce the phase difference. If, after a number of adjustments, the BITCK signal delayed by delay 50A at 711 and delayed by 50B at 712 are in phase, the delay path of delay 50B is the path that provides a 360 degree phase shift to the original signal delayed by 50A. The code 79 ESPP for selecting this 360 degree delay path contains a single "1", the position of which defines the ESP location, or stage DK corresponding to C(K). The difference of the total delay of 50A and 50B is the pure delay of K delay units consisting of 2K inverters, since the path delay or the "intrinsic" delays for the two circuits are the same and should be cancelled out. The output code 79 (C(J) through C(N)) from the up/down shifter 75 contains the ESP information and is used to inform the rotating phase shift control 60, FIG. 1A, of the ESP location. The phase comparator 73 compares the phase of the two delayed copies, of the periodic signal BITCK and determines if further phase adjustment of 50B is needed to align the two, and what direction (up or down) it should be. A ready signal RDY 360 may be supplied to initiate the calibration process.

Figure 4B:
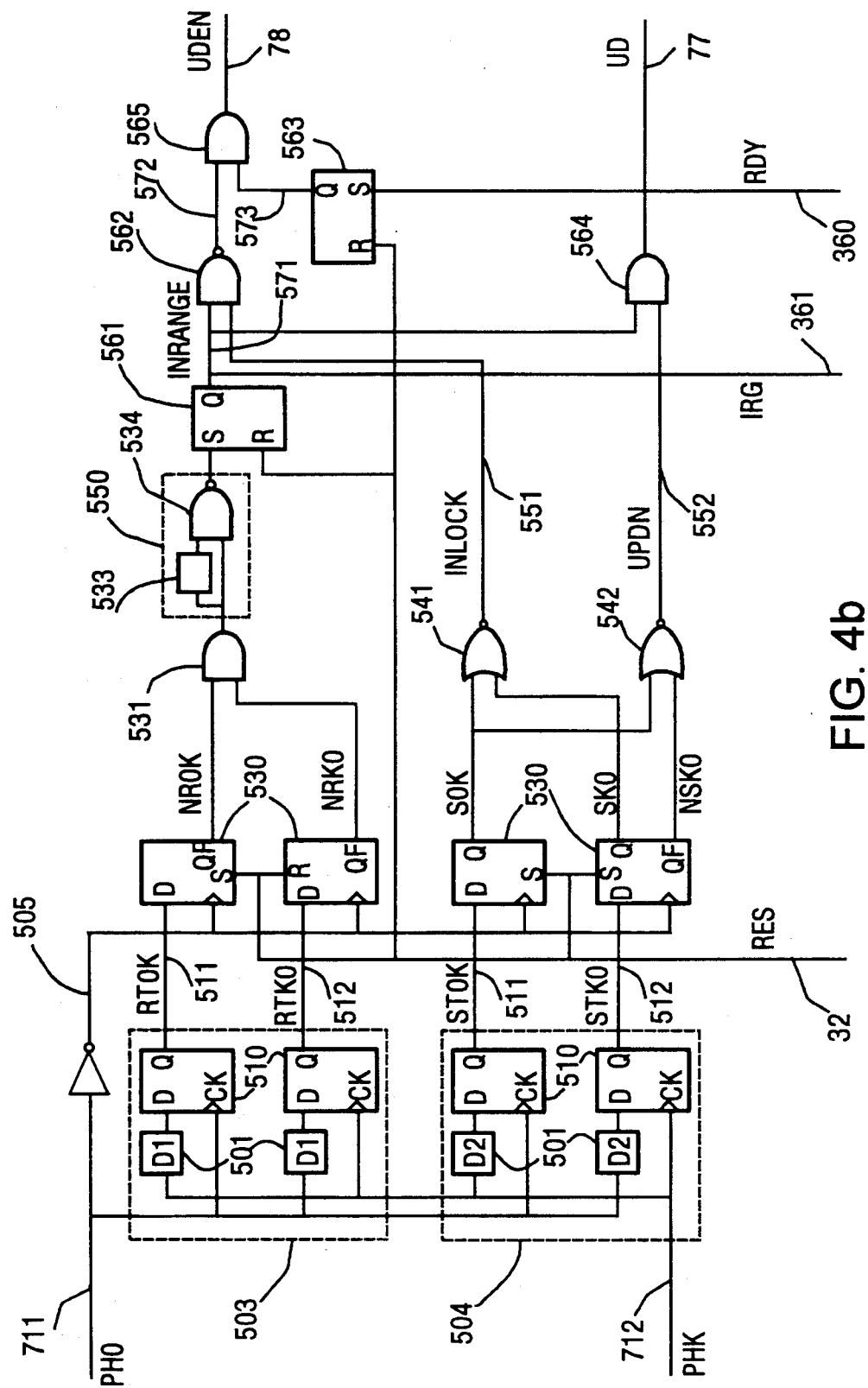
FIG. 4B is block diagram of the Phase Comparator.

The phase comparator circuit 73 could be any phase detector circuit which detects the phase difference of signal ph0 at 711 and phk at 712, and which ensures that correct delay adjust control signal UD77 and UDEN 78 are generated such that phase alignment of ph0 711 and phk 712 is eventually achieved and that the phase difference is 360°, i.e. the delay difference is a full cycle of signal BITCK. FIG. 4B is a preferred embodiment of the phase comparator 73 for providing the delay adjust up-down control signal UD 77 and UDEN 78. The phase comparator circuit 73 is more fully described in the simultaneously filed related application, "Digital Variable In'lock Range Phase Comparator," which has been herein incorporated by reference.

Figure 5:
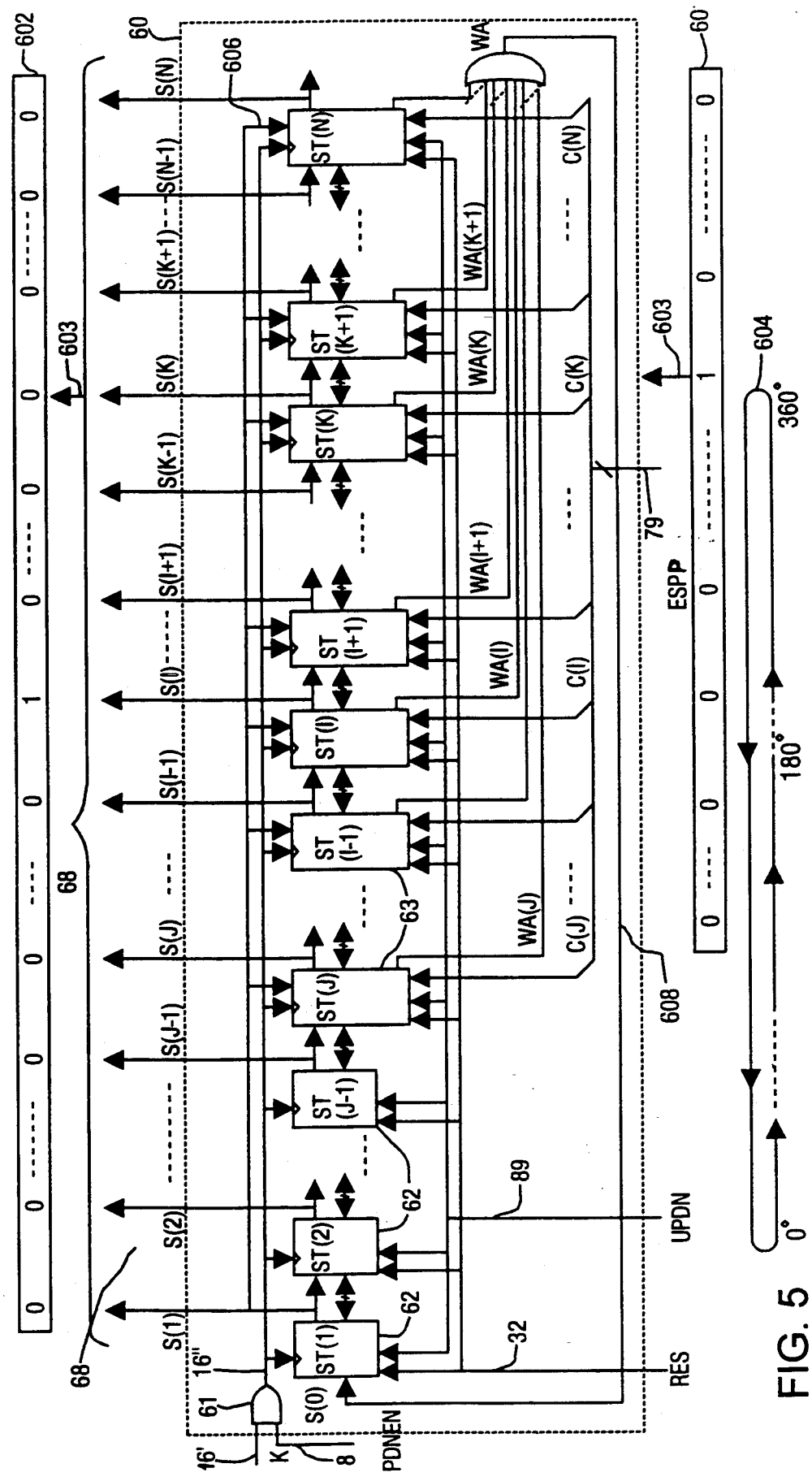
FIG. 5 is the block diagram of one embodiment of the Rotating Phase Shift Control.

FIG. 5 is a detailed block diagram of the Rotating Phase Shift Control 60, FIG. 1A. It contains flip flop register stages ST(1) through ST(N) to form a bidirectional, 360 degree phase rotating shift control. Code 79 is generated from the Phase Shift Range Calibrator 70, FIG. 1A, as described above. The code 79 is shown in box 601 where the location of the "1" is indicated by an arrow 603. In the example shown, stage ST(K) corresponds to the ESP. Positive or "up" incremental phase shift adjustments are executed in a rotational sequence indicated by loop 604. A "1" (indicated in the output code 68 shown in box 602) is shifted to the right at each enabled clock C. This continues until the "1" is shifted to the ESP stage ST(K) such that S(K) becomes a "1".

This means that the signal has been phase-shifted by 360 degrees at this code selection. A further positive phase shift request from the decision circuit will cause the "1" to be wrapped around to stage 1, or S(1) will become a "1", and then continue to right-shift again assuming the "UP" is maintained. Note that this rotating shifting takes place in the range of ST(1) through ST(K), and is "blocked" by the ESPP from shifting further to the right. In practice, when the "1" is shifting while it is away from the ESPP, neither the immediate detection nor the exact location of ESPP is important, and the completion of calibration to find the ESPP needs only be made in relatively long time interval, or when the "1" is approaching the ESPP. The finite error of the 360 degree range calibration due to limited adjustment resolution will cause an uneven adjustment step, i.e. timing jitter, at the "wrap around" position, on the "phase aligned" or "recovered" clock signal in terms of data recovery. Negative or "down" decremental phase shift adjustments are executed in opposite direction. Note in FIG. 5, that stages ST(1) through ST(J-1) 62 can be simpler in structure than those of stage ST(J) through ST(N) 63, because there is no "wrap around" needed for those stages. As explained previously, there is always some minimum number of stages required to delay a full cycle of a given frequency. The clock signal for shift operation is gated by enable signal UPDNEN 88, through gate 61. Proper timing control is required to ensure that no shifting operation takes place for the stage while the signal is in transition to maintain signal integrity. Line 606 feeds the output of S(1) to the ST(K) stage in the event that a "down" or left shift is needed while the "1" has been left shifted in state ST(1). A "down wrap around" will send this "1" back to the ST(K) stage. In normal operations, when a "0" is in ST(1) while a down shift is requested, the "0" is also wrapped around to the ST(K) stage via the same line 606. Outputs WA(I) of all the register stages 63 are ORed into signal WA or as S(0), which is the "up" or right-shift input for ST(1). This will wrap around the output of stage ST(K) to ST(1) in up or right-shift operations. In any event, only one "1" is allowed in all the outputs S(1) through S(N) to ensure that a single phase shifting delay path is enabled. No "1" should be in outputs on right side of the stage ST(K).

Figure 6:
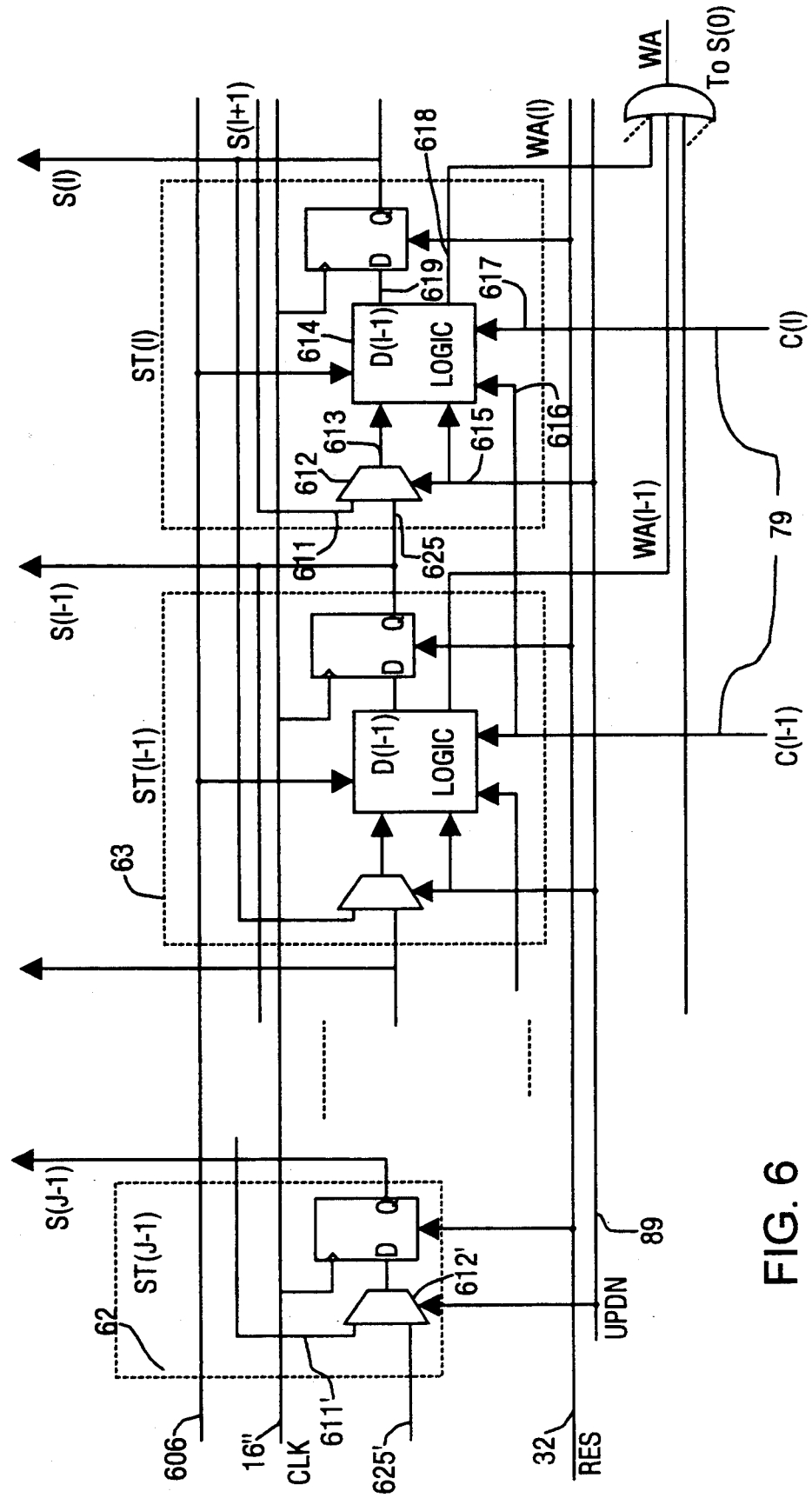
FIG. 6 is the preferred circuit for the register stages in FIG. 5.

FIG. 6 shows a preferred embodiment of the register stages 62 and 63 in FIG. 5. Register stage 62 is one of the simpler register and is used for stages ST(1) through ST(J-1). Depending on whether UPDN 89 is a "1" or a "0", mux 612' selects input from the output on left (previous) stage on line 625', or from the output on right (next) on line 611'. When the gated clock CLK 16" arrives, a "up" or "down" shift is performed. Register stage 63 is the type of register with combinatorial logic used for stage ST(J) through ST(N), FIG. 5. Register stages 63 are the same as register 62 with the addition to register function 62 of a logic block 614. The output of mux 612 on line 613 selects inputs from either the previous stage S(l-1) on line 625, or from the next stage S(l+1) on line 611, depending on control UPDN on line 89. Other inputs to the FIG. 6 logic circuit are the inputs 79 from the phase shift range calibrator 70, FIG. 1 and FIG. 5, both for the current stage C(l) on line 617, and for the previous stage on line 616, and input from stage one S(1) on line 606. The function of the logic becomes easier to understand by also referring to FIG. 7A equations and FIG. 7B truth table for the function. For each register unit ST(l), there are two outputs: S(l), and WA(l). S(l) provides the corresponding digital control input 68 to the digital adjustable delay 50, FIG. 2. WA(l) 608 is the feedback signal to stage one ST(1). In the FIG. 7B truth table shown, row 701 through 704' depicts when "up"-shift is needed (UPDN=1), while row 705 through 708 is when "down"-shift is required. In row 701 and 702, C(I) is a "0", meaning that stage ST(l) is not the ST(K) stage, so normal shift is performed. The status of the previous stage S(l-1) is transferred to the D input of the D flip-flop D(I), and will be latched into S(1) upon the arrival of the clocking edge of CLK 16", while input to stage ST(1) i.e., WA(l) is always a "0". Row 703 and 704 is for the situation when ST(I) is the ST(K) stage (l=K, C(l)=1) or the end stage from which the signal has already been phase-shifted 360 degrees. In row 703, if the output of the previous stage is a "0", the "0" is wrapped around to ST(1) since WA(l) is a "0". In row 704, the previous stage is a "1", while the current stage is the ST(K) (C(l)=C(K)=1), the "1" is not permitted to move to stage ST(l+1), but rather, has to move to the first stage ST(1). A "wrap around" is performed here by making S(l+1) a "0" upon the next clocking edge of CLK 16". This can be seen on row 704', where the current stage is the stage following ESP since C(l−1)=1. During cycle n, if the ST(K) stage is "1" $(S(l-1)_n=1)$, for next cycle (n+1), the current stage will be still set to "0" $(S(l)_{n+1}=0)$, preventing the "1" from shifting beyond ST(K). Meanwhile, at the clocking edge of CLK 16" on cycle n, both $WA(l)_n$ and $S(l)_n$ have been set to "1" (row 704) i.e., S(1) will be set to "1" upon the arrival of clocking edge of cycle (n+1), thus completing the "wrap-around" "1" of ST(K) to stage one or S(1). Row 705 through 708 is for the "down" shift operations (UPDN=0). Row 705 and 706 is similar to the case of row 701 and 702 except that they are left or down shift operations. Row 707 and 708 is the situation when ST(I) is the ST(K) stage or l=K. This time, whatever is in stage ST(1) will be "wrapped around" to ST(l) (l=K). WA(l) is "don't care" since these are down-shift operations. The equations for S(l) and WA(l) are shown on the top of the truth table, FIG. 7A. At power-up, a reset is made such that all stages are "0" except ST(1) which is a "1", so a minimum phase shift is chosen. Meanwhile, the phase range calibrator resets C(J) to "1" while others to "0", so the Stage J is the ST(K) to start. The ST(K) is expected to move "up" to its correct position after the phase range calibrator completes certain number of calibration cycles at which a calibration ready or IN-RANGE signal IRG is generated, and is sent to the rotating phase shift control block 60, FIG. 1A, to initiate the phase adjustment process. The UPDN signal for the delay path selection should choose to up-shift at the start, so a "1" at outputs S(l) is moving "up". In any case, no "1" is allowed to be at the outputs beyond the ST(K). Equation (A) is for stage 1 through stage J-1, while equation (B) and (C) are for stage J through stage N. Circuit implementation can be easily achieved by using conventional combinational circuit design methods or by using a logic synthesizer.

This invention has been described in conjunction with the preferred embodiments. However, it is not intended to be restricted to these embodiments and the scope of the invention shall be determined by the claims. With this in view

I claim:

1. A digitally adjustable, continuously variable length, delay line phase shifter circuit for providing a phase shifted replica of an input signal comprising:

a MUX signal selector;

a delay circuit for receiving said input signal said input signal being connected to an input terminal of a first unit delay element, said delay circuit comprising a series connected plurality of unit delay elements each said unit delay unit element having an input and output terminal, and a plurality of taps connecting to a plurality of said unit delay element inputs and to said MUX signal selector;

means for establishing the position called the 360-degree End Stage Position (ESP) in said delay circuit and for developing a digital command indicative of said ESP;

means for controlling said MUX signal selector responsive to said digital command so that said MUX passes the signal at a selected one of said unit delay inputs through said MUX, said means for controlling said MUX signal selector including means for causing said MUX to select an earlier unit delay element stage output after said input signal, in operation, traversing said delay circuit reaches said ESP and more up delay is requested even though said delay circuit has additional later stages which could have been selected to increase the delay and for alternatively selecting said ESP as said delay circuit output if a down delay is requested and the then selected unit delay is said first unit delay whereby the delay circuit appears to be wrapped around at said ESP to enable continuous phase adjustment with constant steps:

wherein said means for establishing the position called the 360-degree End Stage Position comprises a phase shift range calibrator including a phase comparator means, said phase comparator means having a pair of delay circuits, said pair of delay circuits being identical to said delay circuit for receiving said input signal.

2. The phase shifter of claim 1 wherein said means for controlling said MUX signal selector includes a rotating phase shift control, said rotating phase shift control being responsive to an up and down command signal to cause said MUX signal selector to select an output from a later unit delay element and an earlier unit delay element respectively.

3. The phase shifter of claim 2 wherein said rotating phase shift control includes means to control said delay circuit by providing a digital code word to said MUX.

4. A digital method for providing a feedback controlled and precisely calibrated phase shifted copy of a reference signal comprising:

simultaneously exciting the input of a first, second and third delay line circuit with said reference signal, said delay line circuits being a matched, tapped cascade series of active semiconductors elements where each said delay line circuit includes a minimum delay tap and advances to a maximum delay tap, said delay line circuit further includes means to select one of its said taps as the output of said delay line circuit;

selecting the output of said first delay line circuit to be its said minimum delay tap:

comparing the phase of the output response to said simultaneous excitation of said first delay line circuit to the phase of the output response to said simultaneous excitation of said second delay line circuit and providing an error output signal;

selecting the tap of said second delay line circuit responsive to said error output signal so that the output of said second delay line circuit is phase shifted 360 degrees from the output of said first delay line circuit:

generating responsive to said error output signal a first code indicative of the physical position of said selected output tap of said second delay line circuit;

controlling the delay between said input and output of said third delay line circuit by selecting which one of said third delay line circuit taps is coupled to said output of said third delay line circuit, said step of controlling the delay of said third delay line being responsive to a second code, said second code being provided by a bi-directional, multistage shift register;

controlling the number of stages of said bi-directional multistage shift register responsive to said first code said first code controlling the number of stages in said multistage shift register by controlling which stage of said bi-directional multi stage shift register is connected back to the input of its first stage; and shifting said bi-directional multistage shift register to change said second code, said shifting direction being controlled by a first command and said amount of shift being controlled by a second command.

5. The method of claim 4 where the step of generating a second code in said bidirectional multistage shift register by shifting includes controlling the direction of shifting by providing a one bit binary command and the amount of shifting by controlling the period of time that said second command is active.

6. A digitally controlled phase shifting method for providing an adjustable, feedback controlled and calibrated phase delay comprising:

calibrating a first delay line circuit by identifying a physical position in said first delay line circuit called the ESP (End Stage Position) which said physical position is the exact location at which a signal traversing said first delay line circuit is phase shifted by 360 degrees in relation to an input a signal at a first point in said first delay line circuit, said first delay line circuit includes a high speed position selector responsive to a first code signal, said step of calibrating including, (a) providing, in operation, a detector for identifying when said input signal traversing through said first delay line circuit arrives at said ESP and for generating a first code indicative of the physical position of said ESP, and (b) causing said high speed position selector to connect selectable intermediate positions in said first delay line circuit to the output of said first delay line circuit in response to said first code;

calibrating a second delay line circuit having taps and an output, said calibrating a second delay line circuit comprising, (c) changing the number of stages of a bi-directional multistage shift register responsive to said first code;

(d) generating a second code from said bi-directional multistage shift register by shifting a voltage state to different positions in said bi-directional shift register;

(e) selecting one of said taps to said output of said second delay line circuit responsive to said second code whereby said second delay line output appears to provide a wrap around without discontinuity and a precisely calibrated and selectably adjustable phase signal with respect to an input signal to said second delay line circuit, wherein the input signal to said second delay line circuit is the same as said input signal to said first delay line circuit.

* * * * *